United States Patent
Chiang et al.

(10) Patent No.: US 6,306,678 B1
(45) Date of Patent: Oct. 23, 2001

(54) PROCESS FOR FABRICATING A HIGH QUALITY CMOS IMAGE SENSOR

(75) Inventors: An-Min Chiang, Hsin-Chu; Chi-Hsiang Lee, Hua-Lien; Wei-Kun Yeh; Hua-Yu Yang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,122

(22) Filed: Dec. 20, 1999

(51) Int. Cl.[7] .................................................. H01L 21/00
(52) U.S. Cl. ................ 438/60; 438/57; 438/59; 438/73; 438/75; 257/233
(58) Field of Search .................. 438/57, 59, 60, 438/73, 75; 257/233

(56) References Cited

U.S. PATENT DOCUMENTS

| 5,789,774 | 8/1998 | Merrill | 257/292 |
|---|---|---|---|
| 5,841,176 | 11/1998 | Merrill | 257/446 |
| 5,904,493 | 5/1999 | Lee et al. | 438/57 |
| 5,932,873 | 8/1999 | Bergemont et al. | 250/208.1 |
| 6,177,293 | * 1/2001 | Netzer | 438/73 |

* cited by examiner

Primary Examiner—John F. Niebling
Assistant Examiner—Jennifer M. Kennedy
(74) Attorney, Agent, or Firm—George O. Saile; Stephen B. Ackerman

(57) ABSTRACT

A process of fabricating an image sensor cell, on a semiconductor substrate, with the image sensor cell exhibiting low dark current generation, and high signal to noise ratio, has been developed. The process features the use of a photoresist shape, used to protect a previously formed photodiode element, from an reactive ion etching procedure, used to define insulator spacers on the sides of a polysilicon gate structure, of a reset transistor structure This process sequence avoids damage to the surface of an N type component, of the photodiode element, resulting in the improved electrical characteristics, when compared to counterpart image sensor cells, in which the photodiode element was subjected to the insulator spacer definition procedure.

17 Claims, 4 Drawing Sheets

Table 1 – Characteristics of Image Sensor Cells

| Process | S/N | Dark Current (mV/sec) |
|---|---|---|
| Std Process (unprotected N type region) | 216.7 | 73.8 |
| Protected N type region | 287.5 | 47.2 |

PROCESS FOR FABRICATING A HIGH QUALITY CMOS IMAGE SENSOR

BACKGROUND OF THE INVENTION

(1) Field of the Invention

The present invention relates to methods used to fabricate semiconductor devices, and more specifically to a method used to fabricate an image sensor cell

(2) Description of Prior Art

Image sensor cells are usually comprised of active image sensing elements, such as photodiodes, in addition to adjacent transistor structures, such as transfer gate transistors, and reset transistors. These transistor structures, as well as additional devices, used for the control and signal circuits, in the peripheral regions of the image sensor cell, are comprised with complimentary metal oxide semiconductor, (CMOS), devices. Therefore to reduce process cost and complexity, the image sensor cell has also been fabricated using CMOS process sequences. However the quality of the photodiode element, of the image sensor cell, can be degraded if subjected to traditional CMOS process sequences. For example the insulator spacer, formed on the sides of the reset transistor structure, can damage a semiconductor surface, such as an N type element, of the photodiode, resulting in image sensor characteristics, such as low signal to noise, (S/N), ratios, as well as high dark current generation.

This invention will describe a process sequence for forming insulator spacers on the sides of gate structures, after formation of the N type element, of the photodiode, however with the N type element, protected from the spacer etch procedure, by an overlying insulator layer, the same insulator layer used to create the insulator spacers. This novel sequence results in higher S/N ratios, as well as lower dark current propagation, than counterparts in which the surface of the photodiode was subjected to damaging process sequences, such as the spacer etch procedure. Prior art, such as Merrill in U.S. Pat. No. 5,789,774, as well as Merrill, in U.S. Pat. No. 5,841,176, describe fabrication sequences for an active pixel sensor, or for image censor cells, however these prior art do not show the novel process sequence, described in this present invention, in which an N type, photodiode element is protected for damaging spacer definition procedures.

SUMMARY OF THE INVENTION

It is an object of this invention to fabricate an image sensor cell with a high S/N ratio, and low dark current generation.

It is another object of this invention to form the N type element, of the photodiode, prior to formation of insulator spacers on the sides of the gate structures, used in the image sensor cell, and on the sides of gate structures, used for CMOS devices, in peripheral regions of the cell.

It is yet another object of this invention to protect the N type element, of the photodiode, from the insulator spacer etch procedure, with an insulator shape, created from the same insulator layer that is being used for definition of the spacers.

In accordance with the present invention, a process sequence for forming a image sensor cell, in which the surface of a photodiode structure is protected from degrading CMOS processing sequences, such as insulator spacer definition, has been developed. After formation of the polysilicon gate structure, on an underlying gate insulator layer, to be used as a reset transistor structure, a lightly doped, source/drain region is formed in an area of a P type semiconductor substrate, not covered by the polysilicon gate structure. An N well region, or the N type segment, of a photodiode element, is next formed in a region of the P type semiconductor substrate, or formed in a P well region, previously created in a region of the semiconductor substrate to be used to accommodate the photodiode element. After deposition of a silicon oxide layer, a photoresist shape is formed, and used as a mask to protect the underlying silicon oxide layer from an anisotropic, reactive ion etching, (RIE), procedure, used to form silicon oxide spacers on the sides of the polysilicon gate structure, of the reset transistor structure, and used to form a silicon oxide shape, overlying the N type segment of the photodiode element. After removal of the photoresist shape, a heavily doped, N+ source/drain region, is formed in a region of the semiconductor substrate not covered by the polysilicon gate structure, not covered by the silicon oxide spacers, and not covered by the silicon oxide shape, overlying the N type segment of the photodiode element. Deposition of an interlevel dielectric, (ILD), layer, is followed by a contact hole opening made in the ILD, and in the silicon oxide layer, exposing a portion of the top surface of the N type segment of the photodiode element. Openings are also made in the ILD layer exposing a portion of the top surface of the N+ source/drain region, used for the readout region for the image sensor cell, as well as exposing a portion of the top surface of the polysilicon gate structure, of the reset transistor. Metal contact structures are then formed in these openings.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
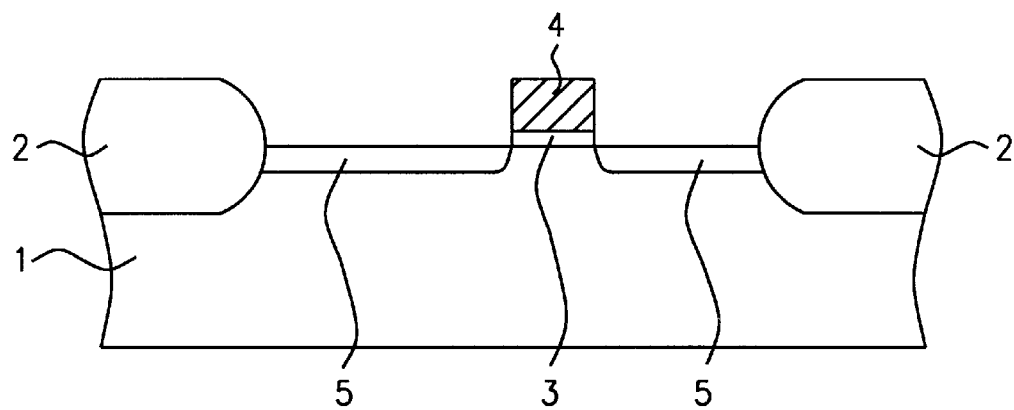
FIGS. 1A, 1B, 2–5, and 6B, which schematically, in cross-sectional style, describe key stages of fabrication of the image sensor cell, featuring protection of an N type segment of the photodiode element, from subsequent dry etching procedures.
Figure 1B:
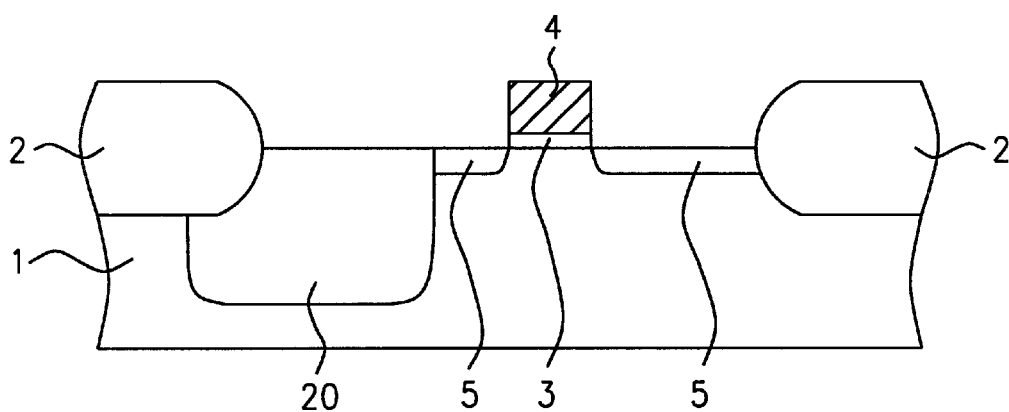

The method of fabricating an image sensor cell, featuring a photodiode, formed prior to, and then protected from, insulator spacer definition, will now be described in detail. A P type, semiconductor substrate 1, comprised of single crystalline silicon, with a <100> crystallographic orientation, is used and schematically shown in FIG. 1A. If desired, a P well region 20, can be formed in the region of semiconductor substrate 1, designed to accommodate the subsequent, photodiode element, of the image sensor device. This is schematically shown in FIG. 1B. However for the description of this invention, the bottom segment of the photodiode element will be the P type semiconductor substrate. Field oxide, (FOX), regions 2, used for isolation purposes, are obtained via thermal oxidation procedures, at a thickness between about 4000 to 6000 Angstroms, in regions of semiconductor substrate 1, not protected by an oxidation resistant pattern, such as a silicon nitride pattern. After formation of FOX regions 2, the silicon nitride pattern, previously formed via conventional photolithographic and reactive ion etching, (RIE), patterning procedures, applied to a silicon nitride layer, or a composite insulator layer, comprised of a silicon nitride layer on a silicon oxide layer, is removed via wet etch procedures, using a hot phosphoric acid solution.

A silicon dioxide, gate insulator 3, is thermally grown to a thickness between about 70 to 200 Angstroms, followed by the deposition of, and the patterning of, a polysilicon layer, creating polysilicon gate structure 4, on silicon dioxide, gate insulator 3. This is schematically shown in FIG. 1A. The polysilicon layer is obtained via low pressure chemical vapor deposition, (LPCVD), procedures, at a thickness between about 2500 to 4000 Angstroms, with the polysilicon layer doped in situ, during deposition, via the addition of arsine, or phosphine, to a silane ambient. The polysilicon layer can also be deposited intrinsically then doped via implantation of arsenic, or phosphorous ions. Patterning of the polysilicon layer is accomplished via conventional photolithographic and anisotropic RIE procedures, using $Cl_2$ as an etchant. The photoresist shape used for definition of polysilicon gate structure 4, is removed via plasma oxygen ashing and careful wet cleans, with the portion of silicon dioxide layer 3, not covered by polysilicon gate structure 4, removed during a buffered hydrofluoric acid cycle, used as part of the wet clean procedure. Lightly doped, N type source/drain region 5, is next formed in regions of semiconductor substrate 1, not covered by polysilicon gate structure 4, or occupied by FOX regions 2. Lightly doped, N type source/drain region 5, is formed via ion implantation procedures, using arsenic, or phosphorous ions, at an energy between 30 to 70 KeV, at a dose between about 5E12 to 5E13 atoms/cm$^2$. The results of these procedures are schematically illustrated in FIG. 1A. The formation the polysilicon gate structure, as well as the formation of the lightly doped, N type source/drain region, for the image sensor cell, is formed simultaneously with the gate structures, and lightly doped source/drain regions, located in peripheral regions of the image sensor cell.

If desired the photodiode element can be subsequently formed in P well region 20, shown schematically in FIG. 1B, instead of being placed in P type, semiconductor substrate 1, as shown in FIG. 1A. This can be accomplished by formation of P well region 20, in P type, semiconductor substrate 1, via implantation of boron, or $BF_2$ ions, in a region of the P type, semiconductor substrate, not protected by a photoresist block out shape. After ion implantation, at an energy between about 70 to 120 KeV, at a dose between about 1E12 to 1E13 atoms/cm$^2$, the masking photoresist shape is removed via plasma oxygen ashing and careful wet cleans.

Figure 2:
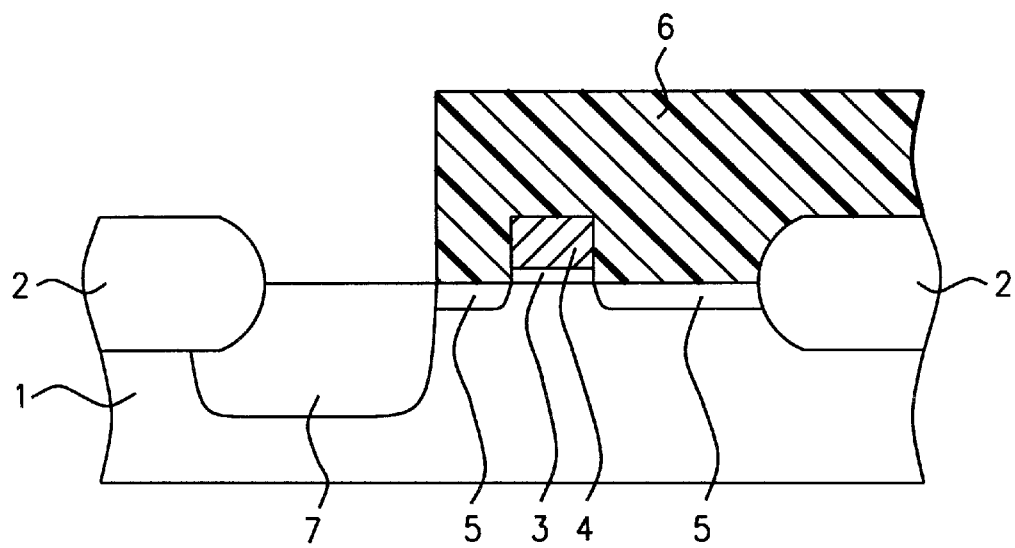

N type region 7, of a photodiode element, is next formed, and shown schematically in FIG. 2. Photoresist shape 6, is formed, and used as a block out mask, to allow N type region 7, to be formed in the region of P type semiconductor substrate 1, used for the photodiode element of the image sensor cell. N type region 7, is obtained via ion implantation of arsenic, or phosphorous ions, at an energy between about 50 to 180 KeV, at a dose between about 1E13 to 5E15 atoms/cm$^2$. The photodiode element, comprised of N type region 7, in P type, semiconductor substrate 1, is now complete. Removal of photoresist shape 6, is accomplished via plasma oxygen ashing and careful wet cleans.

Subsequent processing, needed to form the insulator spacers on the sides of polysilicon gate structure 4, can however be deleterious to electrical characteristics of the photodiode element, in terms of damage to the exposed surface of the N type region 7, during the anisotropic RIE procedure, used to define the insulator spacers. The surface damage, sustained by N type region 7, during the spacer definition can result in unwanted increases in dark current generation, as well as unwanted decreases in signal to noise, (S/N), ratios, for the subsequent image sensor cell. Therefore the novel process sequence, described in this present invention, features the formation of insulator spacers, however with the use of a photoresist shape protecting the underlying N type region from the anisotropic, RIE procedure, while unprotected regions of this same insulator layer are subjected to the same anisotropic RIE procedures, creating insulator spacers on the sides of polysilicon gate structure 4.

Figure 3:
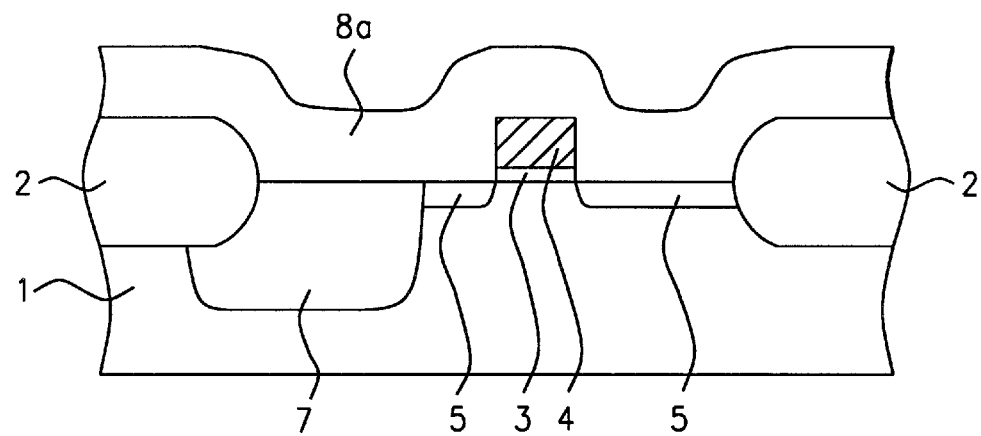
Figure 4:
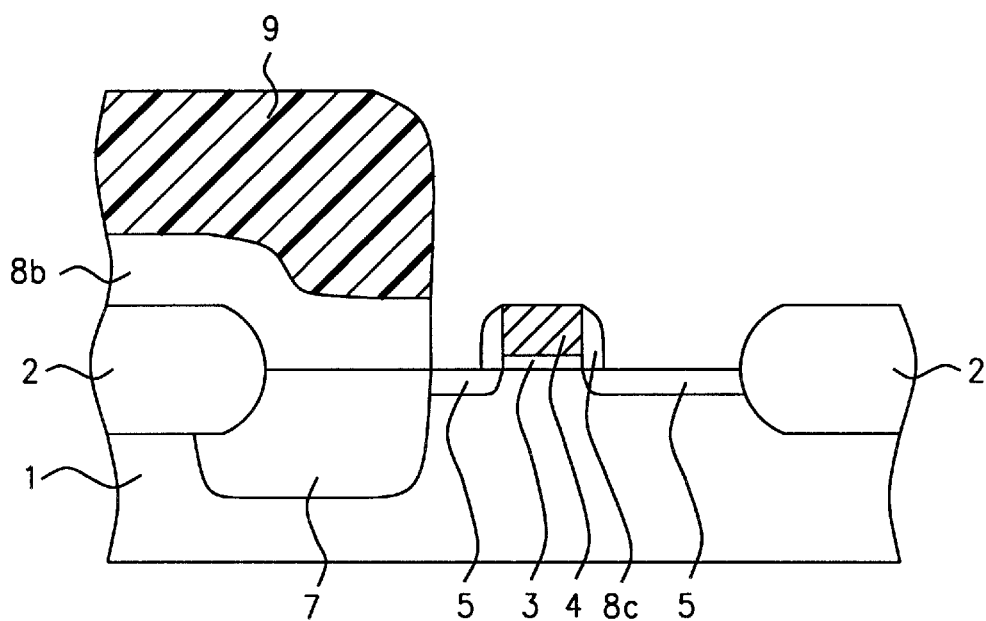

Insulator layer 8a, comprised of silicon oxide, obtained via LPCVD or via plasma enhanced chemical vapor deposition, (PECVD), procedures, using tetraethylorthosilicate, (TEOS), as a source, is deposited at a thickness between about 2000 to 3000 Angstroms. This is schematically shown in FIG. 3. Photoresist shape 9, schematically shown in FIG. 4, is then formed, and used to protect N type region 7, from an anisotropic RIE procedure, using $CHF_3$ as a etchant, in turn used to form insulator spacers 8c, on the sides of polysilicon gate structure 4, and to form insulator shape 8b, directly overlying N type region 7. The use of photoresist shape 9, protected N type region 7, from the spacer definition process, and thus prevented surface damage of the N type region, reducing the risk of subsequent dark current generation, Photoresist shape 9, is than removed via plasma oxygen ashing and careful wet cleans.

Figure 5:
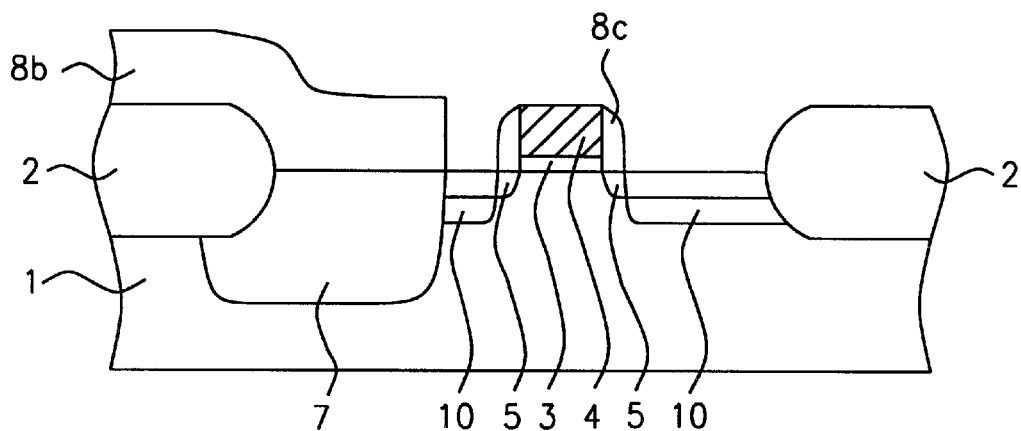

Heavily doped, N+ source/drain region 10, is next formed in regions of the semiconductor substrate, not covered by polysilicon gate structure 4, not covered by insulator spacers 8c, and not covered by insulator shape 8b, overlying N type region 7. Heavily doped, N+ source/drain region, of reset transistor structure 11, schematically shown in FIG. 5, is formed via ion implantation of arsenic, or phosphorous ions, at an energy between about 40 to 80 KeV, at a dose between about 1E15 to 5E15 atoms/cm$^2$.

Figure 6A:
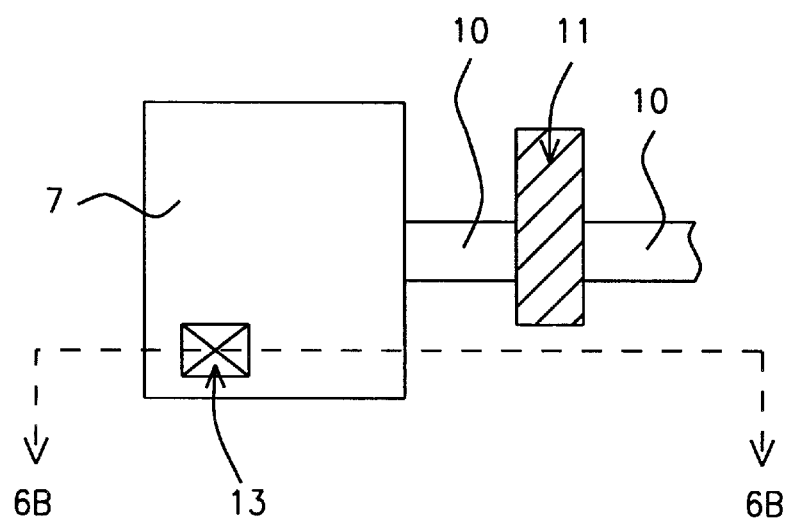
FIG. 6A, which schematically shows a top view of the image sensor cell, described in this invention, at a key stage of fabrication.
Figures 6B, 7:
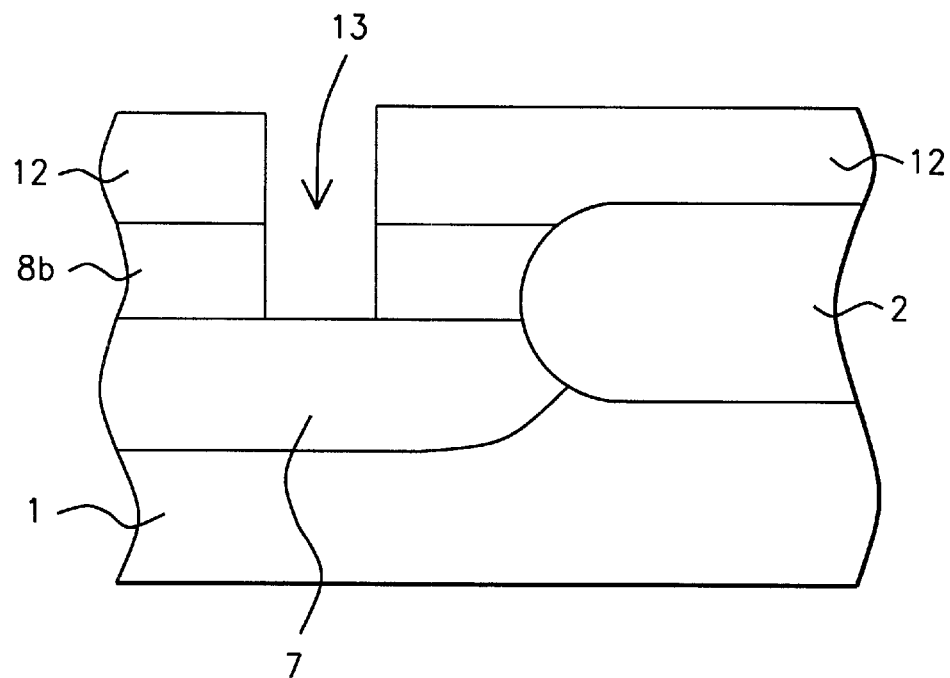
FIG. 7, which in tabular form, compares the electrical characteristics of the image sensor cell, formed using the invented process sequence of this invention, versus the electrical characteristics of an image sensor cell formed without the use of the process sequence, detailed in this present invention.

Completion of the fabrication of the image sensor cell is next addressed and shown schematically in FIGS. 6A, and 6B. An interlevel dielectric, (ILD), layer 12, such as silicon oxide, or borophosphosilicate glass, (BPSG), is deposited via LPCVD or PECVD procedures, at a thickness between about 6000 to 14000 Angstroms. Conventional photolithographic and RIE procedures, are used to open contact hole 13, in ILD layer 12, an in underlying insulator shape 8b, exposing a portion of the top surface of N type region 7, of the photodiode element. This is schematically shown, in cross-sectional style in FIG. 6B, with the top view of the image sensor cell, shown schematically in FIG. 6A. The photoresist shape used to define contact opening 13, is once again removed using plasma oxygen ashing and careful wet clean procedures. A metal interconnect, and contact structure, not shown in the drawings, is then formed in contact hole 13, overlying and contacting, the portion of N type region 7, exposed in contact hole 12. The metal structure can be comprised of aluminum, aluminum—copper, or tungsten.

The electrical characteristics of the image sensor cell, formed using the novel process sequence described in this invention, versus the electrical characteristics of counterpart image sensor cells, formed with a photodiode region being subjected to the insulator spacer definition procedure, is shown in tabular form, in FIG. 7. The reduction in surface damage of the photodiode element, via protection of this region during the spacer definition procedure, resulted in an S/N ratio of about 287, versus a lower ratio of only about 217 for the cell formed without protection of the photodiode region, during the spacer definition procedure. In addition a reduction in dark current generation is also obtained using the process sequence described in this invention, when compared to counterparts fabricated with the photodiode element being subjected to insulator spacer formation.

While this invention has been particularly shown and described with reference to the preferred embodiments thereof, it will be understood by those skilled in the art that various changes in form and details may be made without departing from the spirit and scope of this invention.

What is claimed is:

1. A method of forming an image sensor cell, on a semiconductor substrate, in which a photodiode element, is protected from all ion implantation procedures other than the ion implantation procedure used to form said photodiode element, and protected from a procedure used to define insulator spacers on the sides of a reset transistor, gate structure, comprising the steps of:

forming a gate structure, for a reset transistor structure, on an underlying gate insulator layer, on a first portion of said semiconductor substrate, of a first conductivity type;

forming a lightly doped source/drain region, of a second conductivity type, in an area of said first portion of said semiconductor substrate, not covered by said gate structure;

forming a top segment of said photodiode element, of a second conductivity type, in a second portion of said semiconductor substrate;

depositing a first insulator layer;

forming a photoresist shape on a portion of said first insulator layer overlying said top segment of said photodiode element, leaving regions of said first insulator layer, overlying said gate structure, and overlying said lightly doped source/drain regions unprotected;

performing an anisotropic, reactive ion etching procedure, to from insulator spacers, on the sides of said gate structure, and forming a first insulator shape, on said top segment of said photodiode element, underlying photoresist shape;

forming a heavily doped source/drain region, of a second conductivity type, in an area of said first portion of said semiconductor substrate, not covered by said gate structure, and not covered by said insulator spacers;

depositing a second insulator layer;

opening a contact hole in said second insulator layer, and in said first insulator shape, exposing a portion of the top surface of said top element of said photodiode element; and forming a metal structure, in said contact hole.

2. The method of claim 1, wherein said semiconductor substrate, is a P type, semiconductor substrate.

3. The method of claim 1, wherein said gate structure is a polysilicon gate structure, obtained via deposition of a polysilicon layer, via LPCVD procedures, at a thickness between about 2500 to 4000 Angstroms, and defined via anisotropic RIE procedures, using $Cl_2$ as an etchant.

4. The method of claim 1, wherein said lightly doped source/drain region is an N type, lightly doped source/drain region, formed via ion implantation of arsenic, or phosphorous ions, at an energy between about 30 to 70 KeV, and at a dose between about 5E12 to 5E13 atoms/cm$^2$.

5. The method of claim 1, wherein said top segment of said photodiode element, is an N type region, obtained via an ion implantation procedure, performed at an energy between about 50 to 180 KeV, and at a dose between about 1E13 to 5E15 atoms/cm$^2$.

6. The method of claim 1, wherein said first insulator layer is a silicon oxide layer, obtained via LPCVD or PECVD procedures, at a thickness between about 2000 to 3000 Angstroms, using tetraethylorthosilicate, (TEOS), as a source.

7. The method of claim 1, wherein said insulator spacers, on the sides of said gate structure, and wherein said first insulator shape, located overlying said top segment, of said photodiode element, are formed via an anisotropic RIE procedure, performed on said first insulator layer, using $CHF_3$ as an etchant.

8. The method of claim 1, wherein said heavily doped source/drain region is an heavily doped, N+ source/drain region, obtained via ion implantation of arsenic, or phosphorous ions, at an energy between about 40 to 80 KeV, and at a dose between about 1E15 to 5E15 atoms/cm$^2$.

9. The method of claim 1, wherein said second insulator layer is a silicon oxide layer, or a borophosphosilicate glass layer, obtained via LPCVD or PECVD procedures, at a thickness between about 6000 to 14000 Angstroms.

10. A method of forming an image sensor cell, on a semiconductor substrate, in which an N type segment, of a photodiode element, is protected from all ion implantation procedures other than the ion implantation procedure used to form said N type segment of said photodiode element, and protected from a procedure used to define insulator spacers on the sides of a reset transistor, gate structure, comprising the steps of:

forming a polysilicon gate structure, on an underlying silicon dioxide gate insulator layer, on a first portion of a P type semiconductor substrate;

forming an N type, lightly doped source/drain region, in an area of said first portion of said P type semiconductor substrate, not covered by said polysilicon gate structure;

forming said N type segment in a second portion of said P type semiconductor substrate, creating said photodiode element, comprised of said N type segment, and an underlying region of said P type semiconductor substrate, depositing a first silicon oxide layer;

forming a photoresist shape on the portion of said first oxide layer which overlays said N type segment of said photodiode element;

performing an anisotropic RIE procedure, forming silicon oxide spacers on the sides of said polysilicon gate structure, and forming a silicon oxide shape, on said N type segment, of said photodiode element;

forming a heavily doped, N+ source/drain region in an area of said first portion of said P type semiconductor substrate, not covered by said polysilicon gate structure, and not covered by said silicon oxide spacers;

depositing a second silicon oxide layer;

forming a contact hole opening, in said second silicon oxide layer, and in said silicon oxide shape, exposing a portion of the top surface of said N type segment, of said photodiode element; and forming a metal structure in said contact hole opening.

11. The method of claim 10, wherein said polysilicon gate structure is obtained via deposition of a polysilicon layer, using LPCVD procedures, at a thickness between about 2500 to 4000 Angstroms, then defined via anisotropic RIE procedures, using $Cl_2$ as an etchant.

12. The method of claim 10, wherein said N type, lightly doped source/drain region is, formed via ion implantation of arsenic, or phosphorous ions, at an energy between about 30 to 70 KeV, and at a dose between about 5E12 to 5E13 atoms/cm$^2$.

13. The method of claim 10, wherein said N type segment of said photodiode element, is an N type region, obtained via an ion implantation procedure, performed at an energy between about 50 to 180 KeV, and at a dose between about 1E13 to 5E13 atoms/cm$^2$.

14. The method of claim 10, wherein said first silicon oxide layer is obtained via LPCVD or PECVD procedures, at a thickness between about 2000 to 3000 Angstroms, using tetraethylorthosilicate, (TEOS), as a source.

15. The method of claim 10, wherein said silicon oxide spacers, on the sides of said polysilicon gate structure, and said silicon oxide shape, located overlying said N type segment, of said photodiode element, are formed via an anisotropic RIE procedure, performed on said first silicon oxide layer, using $CHF_3$ as an etchant.

16. The method of claim 10, wherein said heavily doped, N+ source/drain region is formed via ion implantation of arsenic, or phosphorous ions, at an energy between about 40 to 80 KeV, at a dose between about 1E15 to 5E15 atoms/cm$^2$.

17. The method of claim 10, wherein said second silicon oxide layer is obtained via LPCVD or PECVD procedures, at a thickness between about 6000 to 14000 Angstroms.

* * * * *